US005622892A

United States Patent [19]
Bezama et al.

[11] Patent Number: 5,622,892
[45] Date of Patent: Apr. 22, 1997

[54] METHOD OF MAKING A SELF COOLING ELECTRICALLY PROGRAMMABLE FUSE

[75] Inventors: Raschid J. Bezama, Mahopac; Dominic J. Schepis, Wappingers Falls, both of N.Y.; Krishna Seshan, San Jose, Calif.

[73] Assignee: International Business Machines Corporation, Armonk, N.Y.

[21] Appl. No.: 407,431

[22] Filed: Mar. 17, 1995

Related U.S. Application Data

[62] Division of Ser. No. 258,162, Jun. 10, 1994, abandoned.

[51] Int. Cl.$^6$ .................. H01L 21/306; H01L 21/326
[52] U.S. Cl. .................. 438/601; 437/902; 437/922
[58] Field of Search .................. 437/170, 195, 437/902, 922; 148/DIG. 55; 257/529, 665

[56] References Cited

U.S. PATENT DOCUMENTS

| 3,792,319 | 2/1974 | Tsang | 317/235 R |
|---|---|---|---|
| 4,796,075 | 1/1989 | Whitten | 357/51 |
| 5,244,836 | 9/1993 | Lim | 437/922 |
| 5,252,844 | 10/1993 | Takagi | 257/529 |
| 5,256,899 | 10/1993 | Rangappan | 257/665 |

FOREIGN PATENT DOCUMENTS

| 54-105988 | 8/1979 | Japan. | |
|---|---|---|---|
| 60-84838 | 5/1985 | Japan. | |
| 61-110447 | 5/1986 | Japan. | |
| 62-37944 | 2/1987 | Japan. | |
| 63-278250 | 11/1988 | Japan | 148/DIG. 55 |
| 1-77141 | 3/1989 | Japan. | |
| 2-140999 | 5/1990 | Japan. | |
| 2237446 | 5/1991 | United Kingdom. | |

OTHER PUBLICATIONS

Yu.D. Chistyakov, et al., Soviet Microelectronics, 11(1) (1982) 15, "Effect of structural factors on the write current of a fusible link PROM", Jan. 1982.

"Process and Structure for Laser Fuse Blowing", IBM Technical Disclosure Bulletin, vol. 31, No. 12 (May, 1988), p. 93.

Primary Examiner—Charles L. Bowers, Jr.
Assistant Examiner—Leon Radomsky
Attorney, Agent, or Firm—H. Daniel Schnurmann

[57] ABSTRACT

A method of fabricating an electrically programmable fuse buried under quartz and layers of polyimide with a specific structure to enhance its "thermal" capabilities. The fuse is designed to "blow" and cool off quickly so as not to cause damage to areas above and surrounding the fuse. A passivation layer is added above the fuse to act as a heat sink and absorb and redistribute the heat generated from one localized area to a broader and cooler area. The materials used for the fuse and the heat sink are selected to be compatible with both oxide and polyimide personalization schemes. Modeling of the fuse enables optimizing the characteristics of the fuse, particularly to transmit to the surface of the passivation layer the thermal wave created during programming of the fuse.

11 Claims, 4 Drawing Sheets

$L_F$
fuse link length layer 13 removed for convenience

II -- II

METHOD OF MAKING A SELF COOLING ELECTRICALLY PROGRAMMABLE FUSE

This is a divisional of application Ser. No. 08/258,162 filed Jun. 10, 1994 and now abandoned.

FIELD OF THE INVENTION

This invention relates to the design process and structure of an electrically programmable fuse for use in VLSI circuits, and more particularly to the design of a fuse to prevent thermal damage when the fuse is buried under quartz and under polyimide layers.

BACKGROUND OF THE INVENTION

Electrically programmable fuses have been used extensively in the design and manufacture of Very Large Scale Integrated Circuits (VLSI).

Fuses are oftentimes used for redundancy purposes, wherein certain defective regions within an IC chip or a package can be electrically disconnected and replaced by a functional region. This technique of programming fuses has the advantage of increasing yield and adding flexibility to the circuit designer, and it is easily achieved by a "repair" or EC process well known to those skilled in the art.

In a typical circuit, a fuse may be incorporated in a predetermined region which can selectively be "blown" by applying a current through the fuse that generates sufficient joule heating to cause the fuse to melt, thereby rendering the line electrically isolated from other regions beyond the fuse location.

By way of example, Tsang in U.S. Pat. No. 3,792,319 describes a poly-crystalline silicon fusible link for Programmable Read Only Memories, wherein a doped fusible link is deposited on top of an insulating layer of an IC (Integrated Circuit) and is connected to the circuit through windows in the insulating and/or metallized layers. The fusible link may advantageously be protected by a layer that shields the fusible link and surrounding areas within the IC as well as providing means for minimizing heat transfer.

UK Patent No. 2,237,446A to Machida et al. describes a process wherein an opening is formed on the layers above the fuse region to efficiently dissipate the heat generated during the programming of the fuse. More particularly, all the layers on top of the regions either directly above or surrounding the fuse are removed to prevent damage and allow safe heat dissipation during programming by radiation to the environment. An illustration of this fuse structure is shown in FIG. 1.

Another typical fuse layout is described in Japanese Patent No 60-84838 to Yoshiharu Takeuchi and is illustrated in FIG. 2. Therein is shown a fuse that consists of several layers of thin dielectric films deposited on top of a conducting film made of doped poly-crystalline silicon. The fuse requires to be sufficiently thin to properly heat up during programming and must also be prone to become disabled at reasonable levels of current density. The heat generated during the programming process is considerable, and since many metals and Si melt at temperatures in excess of 1000° C., the heat is dissipated to surrounding areas, usually causing damage such as cracked films, line breaks, destruction of organic layers, and the like.

Inherent to the fuse of the type described by Yoshiharu Takeuchi is a process of removing layers above the fuse with the intent of preventing heat damage to layers above the fuse. As such, Takeuchi uses the first layer of metal contact wiring to act as an etching stop layer when removing the layers above the fuse. Thus, the etch stop layer will be typically separated from the fuse layer by 1000–2000Å of a thin dielectric.

While the teachings of fuse formation and integration are well understood by those skilled in the art, fuses of the type previously described suffer from serious drawbacks.

Firstly, electrically programmable buried fuses create unwanted thermal damage. This is particularly true in an IC containing polyimide layers which are damaged by temperatures larger than 500° C. Such temperatures easily can be reached while programming the fuse.

Secondly, prior art fuses dissipate energy at the expense of sacrificing the area above the fuse. Furthermore, at best only partial control on the amount of material to be removed above the fuse exists altogether. The lack of adequate control leaves the areas above the fuse totally unprotected and prone to extensive thermal damage during the programming phase. Clearly, this is a destructive method to all working areas in proximity of the fuse.

Thirdly, the etch stopping layer taught by Takeuchi is formed in the same plane as the contact metallurgy, which determines the layer thickness and proximity to the fuse and which prohibits any overlap of this etch stop layer with the contacts that could cause short circuits between the fuse contacts. Moreover, it also forces the fuse to be reprogrammed destructively at higher than typical power levels.

Fourthly, the voids left in the area above the fuse circuits in the prior art, lead to a non-planar surface, which is prone to capturing moisture or debris from subsequent handling. Additional masking steps and etching steps such as RIE (Reactive-Ion-Etch) is also required. The additional steps can potentially lead to lower yields and higher cost.

Lastly, the use of an aperture above the fuse to dissipate thermal energy during programming adds to the difficulties in scaling down the fuse dimensions for integration into the VLSI circuitry.

OBJECTS OF THE INVENTION

Accordingly, it is an object of the present invention to provide a fuse that includes a layer designed for thermal protection to safeguard the layers above and in the immediate vicinity of the fuse.

It is another object to provide a "thermal" fuse (i.e., that can "blow" and cool quickly) and which can also, alternatively, effectively damp out the thermal wave formed during fuse programming.

It is a further object to use existing process steps to form the fuse and heat sink combination without additional masking or etching steps.

It is still another object to design a fuse that maximizes yield and chip density in the fuse region of the IC.

It is a more particular object to provide a fuse that can be built during the earlier stages (e.g., device formation) or at the Back-End-of-the-Line (BEOL) stage (e.g., personalization) of an IC manufacturing line.

It is yet a further object to provide a fuse of the same materials and which uses the same manufacturing process as the remainder of the IC chip or package.

It is still a further object to provide a fuse having a specific shape and structure and which "blow" characteristics can be modeled and simulated.

Still another object is to optimize the thermal characteristics of the fuse structure so as to optimize the dimensions.

SUMMARY OF THE INVENTION

In accordance with these and other objects of the invention, there is provided a fuse structure comprising: a first insulating layer formed on top of a substrate; conductive lines and a fuse link connecting two of the conductive lines formed on top of the first insulating layer; at least one second insulating layer formed on top of the conductive lines and the fuse link; a thermally conductive layer formed on top of the second insulating layer to provide heat dissipation, overlapping the fuse link; and at least one third insulating layer formed on top of the thermally conductive layer.

BRIEF DESCRIPTION OF THE DRAWINGS

The invention will be described further, by way of a preferred example thereof, with reference to the accompanying drawings wherein like reference numerals have been used in the several views to depict like elements. In the drawings.

DETAILED DESCRIPTION OF THE INVENTION

Figure 1A:
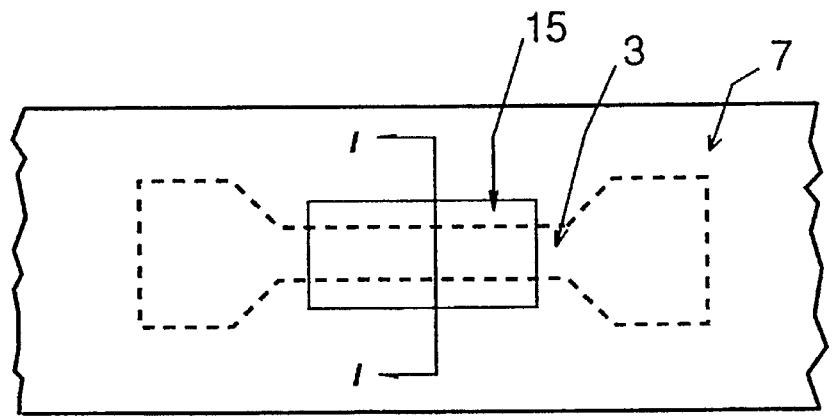
FIGS. 1a–1b are schematic diagrams of a prior art fuse structure.
Figure 1B:
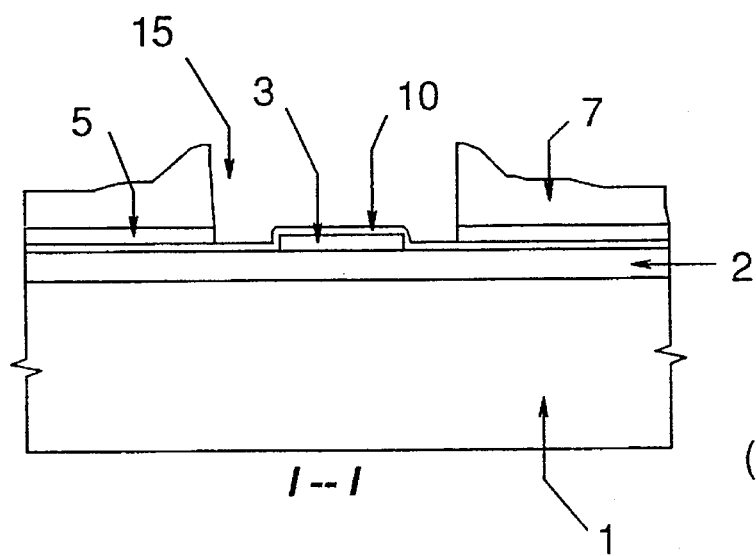

Referring now to FIG. 1a, a prior art fuse structure in a typical IC is shown, where two conductive lines on top of a substrate are connected to each other via fuse. The structure surrounding the fuse is illustrated in more detail in FIG. 1b, showing the fuse from a lateral view. Placed on top of the Si substrate 1 is a thin layer of $SiO_2$ 2. A second passivation layer 10, preferably $Si_3N_4$, is selectively placed on top of fuse 3 to protect the top layer of fuse 3 from contamination and to provide thermal isolation during the programming (i.e., "blow") phase. Additionally, an aperture 15 is opened after the fuse to allow heat dissipation during programming.

Figure 2A:
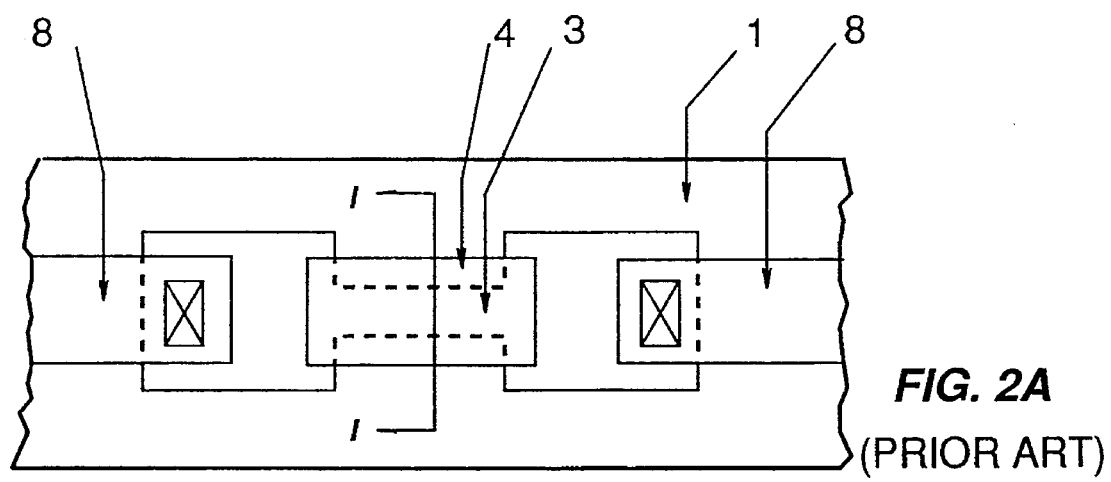
FIGS. 2a–2b are schematic diagrams of a second prior art fuse structure.
Figure 2B:
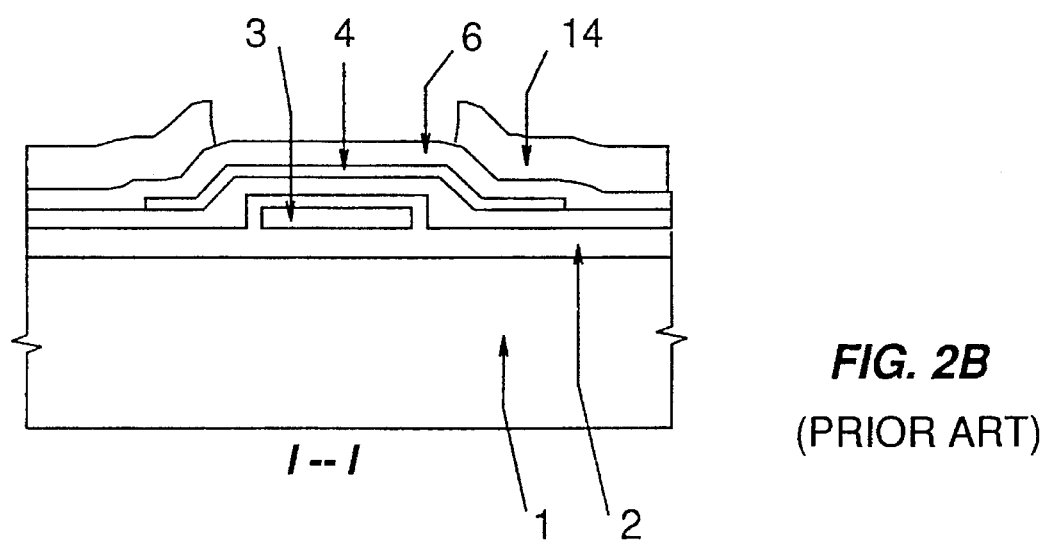

Referring now to FIG. 2 showing a second embodiment of a prior art fuse structure, and more particularly to FIG. 2b, layer 4 acts as an etch stop to ensure that the process of etching does not propagate below a level where the fuse itself could potentially be damaged. A second passivation layer 6 is then deposited on top of layer 4, followed by a third photoresist layer 14, which is etched away by conventional lithographic methods to define the fuse aperture for thermal cooling after etching layer 6, yielding the final configuration of FIG. 2b, which shows the fuse before the layer 6 has been etched but after the photoresist has been patterned.

Figure 3A:
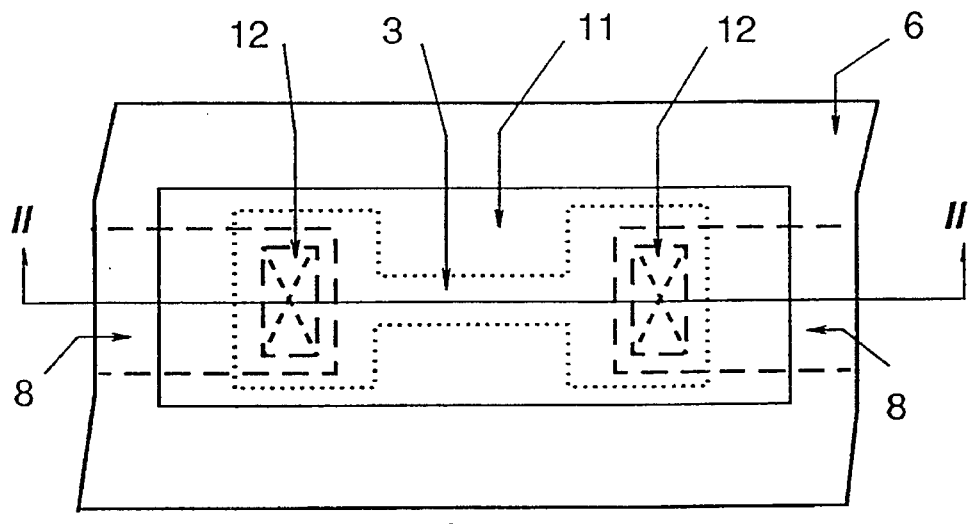
FIGS. 3a–3b are schematic diagrams of the fuse structure in accordance with the teachings of the present invention.
Figure 3B:
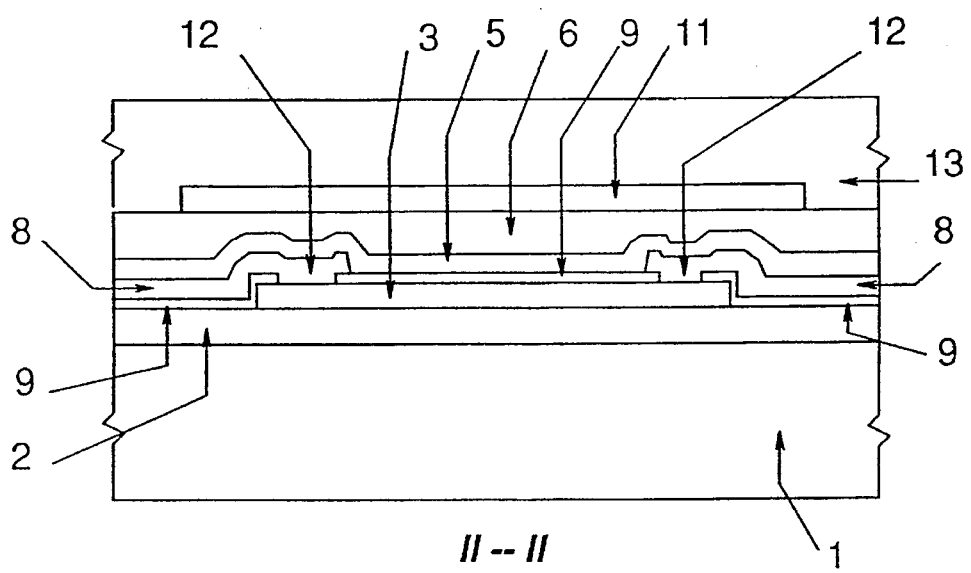

Referring now to FIG. 3, showing a fuse structure in accordance with the teachings of the present invention, a heat sink 11 is placed above fuse link 3 to provide thermal protection to a passivation layer blanketing the structure. By extending the heat sink to include the contact region 12, adequate heat dissipation is provided over the complete area surrounding the fuse link.

The heat sink is made of any material having good thermal conductivity, such as Cu, Al, W, metals, Si, polysilicon, diamond-like, or any other material that can be deposited as a thin-film. Practitioners of the art will readily appreciate that the above mentioned materials have been listed for illustration purposes only, but variations in material composition or thickness will provide similar satisfactory results.

The heat sink layer 11 allows the area above the fuse to be organic or inorganic, and the region directly above or surrounding the fuse may or may not include wiring, thereby increasing the prospects for enhanced wiring density.

In a second embodiment, heat sink 11 is also made from and at the same time as the outlaying material used for subsequent wiring of the structure. As such, the formation of the heat sink 11 occurs without any additional masking or processing steps (e.g., CVD or photolithographic).

Figure 4:
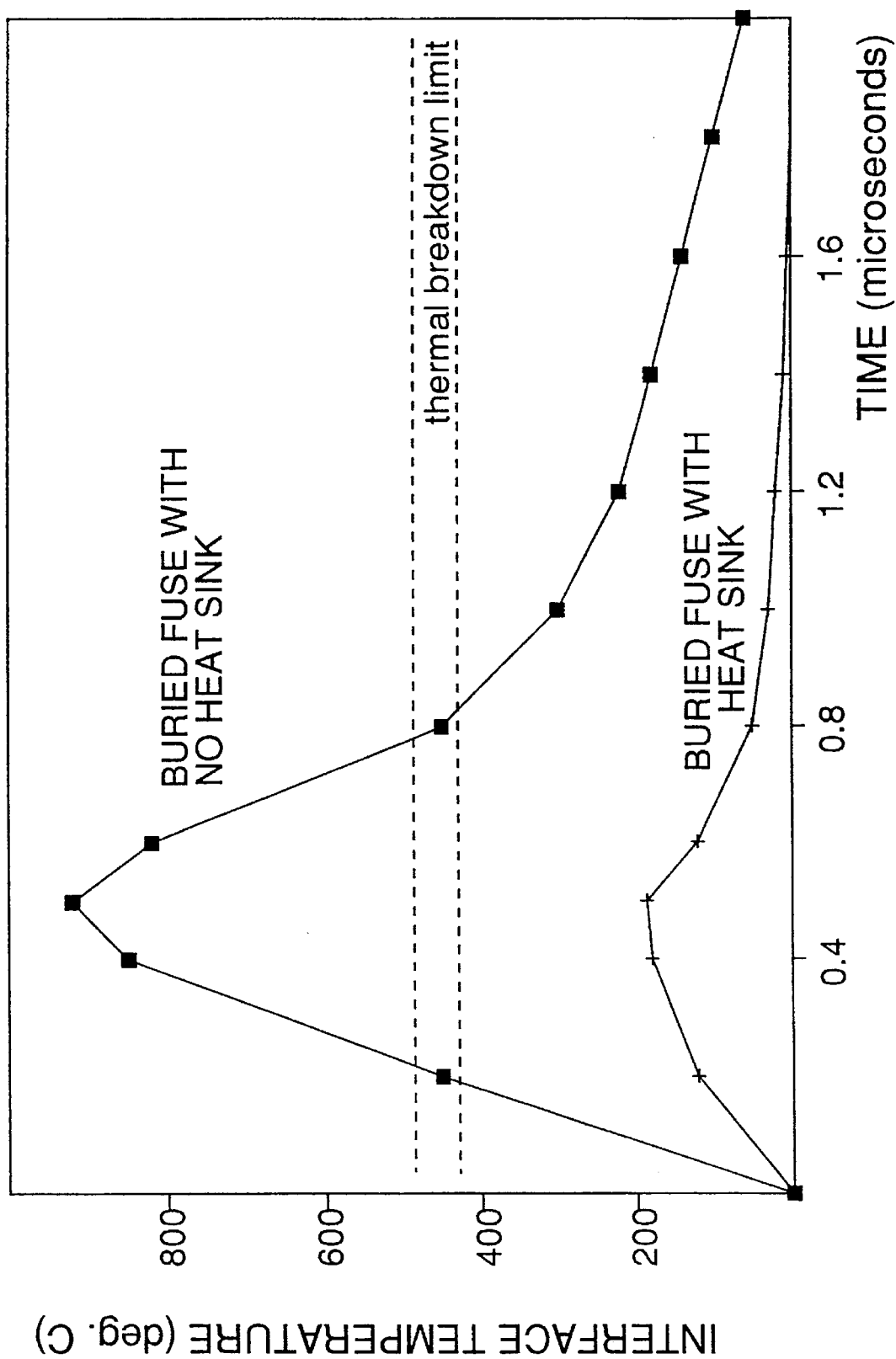
FIG. 4 is a diagram showing the variations of the interface temperature versus elapsed time for a buried fuse with no heat sink in contradistinction with a buried fuse with heat sink, and which highlights the temperature range in which thermal breakdown occurs.

Referring now to FIG. 4, the simulated results of a thermal model are shown. The model is built using the finite elements method and it illustrates the thermal effectiveness of the fuse structure according to the present invention. Its thermal performance is compared to that of a similar structure in which the thermal sink 11 has been removed and by evaluating the temperature history of the insulating layer 13 interface facing the fuse region. An adequate fuse structure must be capable of maintaining the temperature of the interface under the thermal breakdown limit defined by the selection of the insulating material 13. When the insulating material 13 is selected to be polyimide, it is recommended to maintain the interface temperature below 450° C. to prevent thermal damage to the insulating layer.

The thermal performance of a fuse structure that protects the polyimide insulating layer 13 is shown in FIG. 4. The fuse is built over a 5000Å deposition of $SiO_2$ 2 using a layer 3 of polysilicon 2500Å thick. A 1 μm layer of $SiO_2$ is deposited over the fuse, before insulating the structure with 10 microns of polyimide 13. A 2500Å polysilicon heat sink layer 11 is applied between the polyimide layer 13 and the thick $SiO_2$ layer 5, when simulating the presence of a thermal sink. The fuse dimensions are 1.5 microns by 3 microns, whereas the thermal sink dimensions are 5 microns by 7 microns. Experimentally, it has been determined that such fuse structure can be programmed by applying a voltage pulse for at least 0.4 microseconds. The fuse structure containing the heat sink reaches fuse melting temperature after 0.1 microseconds of programming time and the polyimide interface temperature never exceeds 200° C. during the 0.4 microseconds of programmed time. Thus, the described fuse is successful in protecting the polyimide layer from thermal breakdown. However, it is easy to fail on such task if the fuse dimensions are somewhat modified. By way of example, a fuse structure which fails to protect the polyimide interface can be built by decreasing the thickness of the $SiO_2$ layers 5 and 6 from 1 micron to 0.5 microns and by decreasing the thickness of the thermal sink layer 11 from 2500Å to 2000Å. In this case, the interface temperature is expected to exceed 1000° C. and damage of the polyimide layer will ensue.

Thus, the thermal sink layer 11 must meet a minimum criteria to provide an effective energy management function. For the structure shown in FIG. 3, it has been found that if the equation (1) shown below $$K_{HS}/K_{eff\,ox} \cdot H_{HS}/L_F \cdot H_{OX}L_F > 2 \tag{1}$$

wherein, $H_{HS}$=thickness of the heat sink 11

$H_{OX}$=thickness of the layers of 5 & 6

$L_F$=length of the fuse link $K_{HS}$=thermal conductivity of the heat sink $K_{eff\ ox}$=effective thermal conductivity of the insulating layer is satisfied, then the heat sink layer 11 will provide adequate thermal cooling capability. On the other hand, excessive cooling capability characterized by a large value of the heat sink thickness times heat sink thermal conductivity product combined with inadequate heat insulation can prevent the fuse structure from ever reaching melting point in the presence of a constant voltage. Thus, an upper limit to the thickness of the thermal heat sink layer 11 is provided when the insulation capability is reduced. Variations to the above rule are expected depending on the selection of materials used to build the fuse structure. Also, the geometry shape can be altered from the simple geometry used to illustrate the thermal sink layer concept herein described. However, it is expected that a new working range for the heat sink of different materials and configurations containing the fuse structure can be determined by those skilled in the art.

Whereas the present invention has been described having reference to a particular preferred embodiment, those having skill in the art will readily appreciate that the above noted and other modifications to form and detail may be made without departing from the scope and spirit of the invention.

What is claimed is:

1. A method of making a buried semiconductor fuse structure in an integrated circuit comprising:

forming a first insulating layer on a substrate having conductive lines formed thereon;

forming a fuse link comprising a narrow strip having a conductive pad attached at each end, said fuse link connecting at least two of said conductive lines, said fuse link programmed to blow;

forming at least one second insulating layer on said conductive lines and said fuse link;

forming a thermally conductive layer on said second insulating layer and completely covering said fuse link, said thermally conductive layer dissipating heat developed during programming of said fuse link; and providing at least one third insulating layer formed on said thermally conductive layer, wherein said thermally conductive layer shields said conductive lines and said third insulating layer from excessive thermal energy generated during the programming of said fuse link.

2. The method of making a buried semiconductor fuse as recited in claim 1, wherein the step of forming said thermally conductive layer further comprises having said layer overlap said narrow strip and said conductive pads.

3. The method of making a buried semiconductor fuse as recited in claim 1, wherein said thermally conductive layer is selected from a group consisting of Cu, Al, W, Si, polysilicon, and other thermally conductive materials that can be deposited as a thin-film.

4. The method of making a buried semiconductor fuse as recited in claim 1, wherein an effective thermal conduction to thickness ratio of said second insulating layer on top of the fuse link is $$K_{HS}K_{eff\ ox}\cdot H_{HS}/L_F\cdot H_{OX}L_F>2$$

wherein $H_{HS}$=the thickness of said thermally conductive layer, $H_{OX}$=the thickness of said at least second insulating layer and said at least said third insulating layer, $L_F$=the length of said fuse link, $K_{HS}$=the thermal conductivity of said thermally conductive layer, and $K_{eff\ ox}$=the effective thermal conductivity of said at least second insulating layer and said at least third insulating layer.

5. The method of making a buried semiconductor fuse as recited in claim 1, wherein said at least one third insulating layer is polyimide.

6. The method of making a buried semiconductor fuse as recited in claim 1, wherein said at least one third insulating layer further comprises at least one polyimide layer and at least one wiring layer.

7. The method of making a buried semiconductor fuse as recited in claim 1, wherein said second layer has a thermal conductivity lower than 10 w/mk.

8. The method of making a buried semiconductor fuse as recited in claim 1, said third insulating layer further comprises at lest one polyimide layer and at least one wiring layer.

9. The method of making a buried semiconductor fuse as recited in claim 8, wherein the steps of forming the thermally conductive layer and of providing the at least one wiring layer are performed simultaneously.

10. The method of making a buried semiconductor fuse as recited in claim 7, wherein the at least one third insulating layer formed on top of the thermally conductive layer reaches a maximum temperature that remains below 200° C. during programming.

11. A method of making a buried semiconductor fuse structure in an integrated circuit comprising:

forming a first insulating layer on a substrate having conductive lines formed thereon;

forming a fuse link comprising a narrow strip having a conductive pad attached at each end connecting at least two of said conductive lines, said fuse link programmed to blow;

forming a thin $SiO_2$ layer on said conductive lines and said fuse link;

forming a thermally conductive layer on said $SiO_2$ layer on said second insulating layer and completely covering said fuse link, said thermally conductive layer dissipating heat developed during programming of said fuse link; and providing at least one third insulating layer formed on said thermally conductive layer, wherein said thermally conductive layer shields said conductive lines and said third insulating layer from excessive thermal energy generated during the programming of said fuse link.

* * * * *